United States Patent
Nakayama et al.

(10) Patent No.: US 10,402,028 B2
(45) Date of Patent: Sep. 3, 2019

(54) TRANSPARENT CONDUCTIVE FILM, METHOD OF PRODUCING TRANSPARENT CONDUCTIVE FILM, AND TOUCH PANEL

(71) Applicant: FUJIFILM Corporation, Tokyo (JP)

(72) Inventors: Masaya Nakayama, Ashigarakami-gun (JP); Makoto Sutou, Ashigarakami-gun (JP)

(73) Assignee: FUJIFILM Corporation, Tokyo (JP)

(*) Notice: Subject to any disclaimer, the term of this patent is extended or adjusted under 35 U.S.C. 154(b) by 177 days.

(21) Appl. No.: 15/683,013

(22) Filed: Aug. 22, 2017

(65) Prior Publication Data

US 2017/0371453 A1    Dec. 28, 2017

Related U.S. Application Data

(63) Continuation of application No. PCT/JP2015/077555, filed on Sep. 29, 2015.

(30) Foreign Application Priority Data

Mar. 20, 2015 (JP) .................. 2015-057648

(51) Int. Cl.
*H05K 1/00* (2006.01)
*G06F 3/044* (2006.01)
(Continued)

(52) U.S. Cl.
CPC .............. *G06F 3/044* (2013.01); *G06F 3/041* (2013.01); *H05K 1/0274* (2013.01);
(Continued)

(58) Field of Classification Search
CPC ........... G06F 3/044; G06F 3/041; H05K 1/09; H05K 1/00; G09G 1/00; H01L 2924/00
See application file for complete search history.

(56) References Cited

U.S. PATENT DOCUMENTS

2014/0078111 A1* 3/2014 Lee .................. G06F 3/041
                                                 345/176
2015/0177876 A1* 6/2015 Ishii ................ G06F 3/044
                                                 345/174

FOREIGN PATENT DOCUMENTS

JP     2013-129183 A   7/2013
JP      5224203 B1    7/2013
(Continued)

OTHER PUBLICATIONS

International Preliminary Report on Patentability and Written Opinion of the International Searching Authority (Forms PCT/IB/326, PCT/IB/373 and PCT/ISA/237), dated Oct. 5, 2017, for International Application No. PCT/JP2015/077555, with an English translation of the Written Opinion.
(Continued)

*Primary Examiner* — Michael A Faragalla
(74) *Attorney, Agent, or Firm* — Birch, Stewart, Kolasch & Birch, LLP

(57) ABSTRACT

A transparent conductive film includes a transparent insulating substrate, a first electrode, and a second electrode, in which a first thin metal wire 38 of the first electrode has a first front surface 38A being directed to the viewing side and having a line width W1A, and a first back surface 38B being directed to the side opposite to the viewing side and having a line width W1B, a second thin metal wire 39 of the second electrode has a second front surface 39A being directed to the viewing side and having a line width W2A, and a second back surface 39B being directed to the side opposite to the viewing side and having a line width W2B, the W1A, W1B, W2A, and W2B are 0.5 to 10 μm, W1A is larger than W1B and W2A is larger than W2B.

18 Claims, 7 Drawing Sheets

(51) Int. Cl.
*G06F 3/041* (2006.01)
*H05K 1/02* (2006.01)
*H05K 1/09* (2006.01)
*H05K 3/06* (2006.01)

(52) U.S. Cl.
CPC ............ *H05K 1/0296* (2013.01); *H05K 1/09* (2013.01); *H05K 3/06* (2013.01); *G06F 2203/04103* (2013.01); *G06F 2203/04104* (2013.01); *G06F 2203/04107* (2013.01); *G06F 2203/04112* (2013.01); *H05K 1/0289* (2013.01); *H05K 2201/0108* (2013.01)

(56) References Cited

FOREIGN PATENT DOCUMENTS

| | | | |
|---|---|---|---|
| JP | 2013-206315 A | 10/2013 |
| JP | 2013-257755 A | 12/2013 |
| JP | 2014-63466 A | 4/2014 |
| JP | 2014-150118 A | 8/2014 |

OTHER PUBLICATIONS

International Search Report and English translation (Form PCT/ISA/210), dated Nov. 10, 2015, for International Application No. PCT/JP2015/077555.
Japanese Office Action and English translation thereof, dated Nov. 28, 2017, for corresponding Japanese Application No. 2017-507308.

* cited by examiner

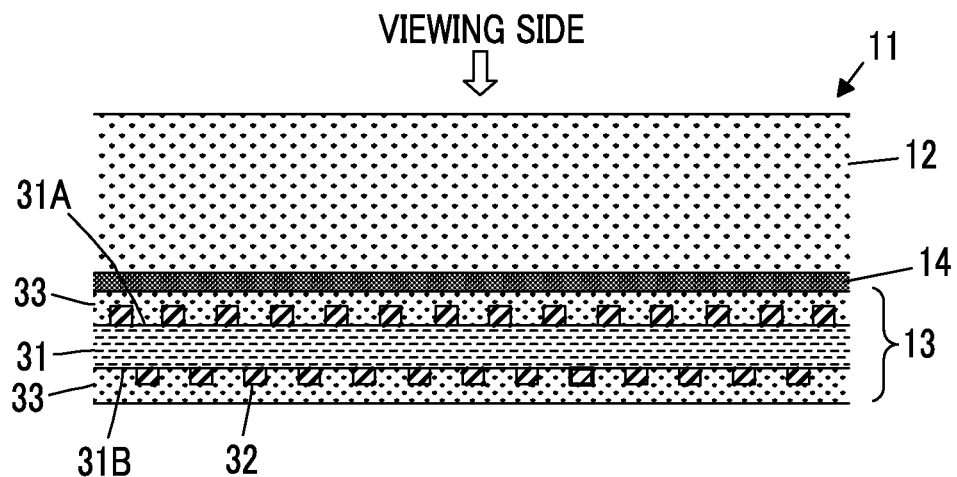
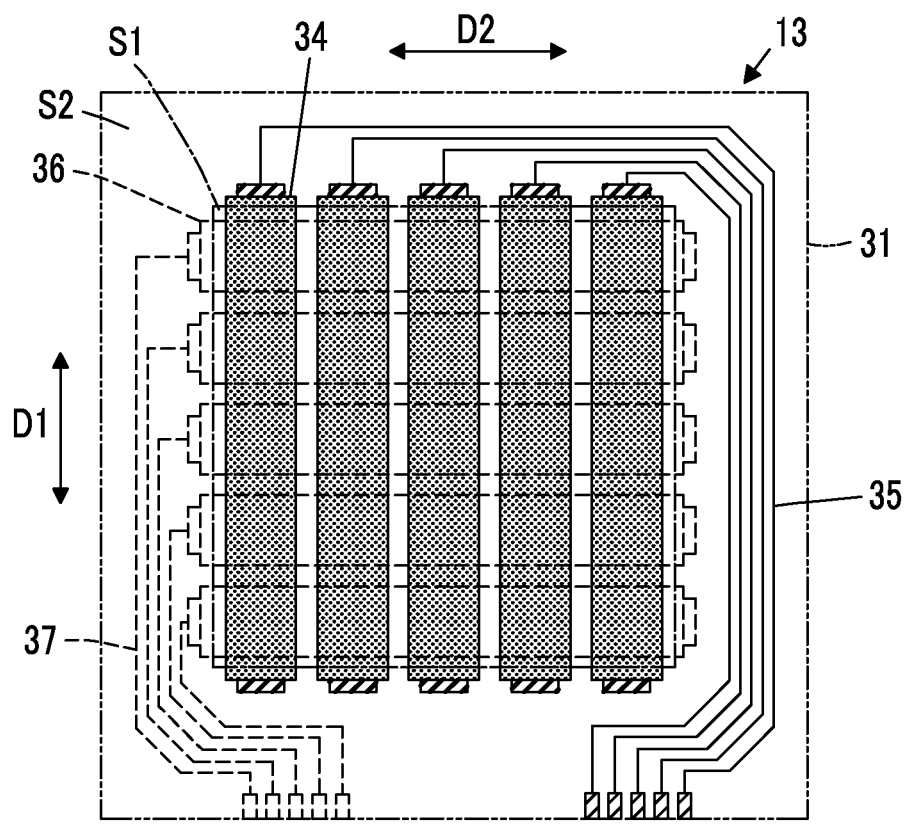

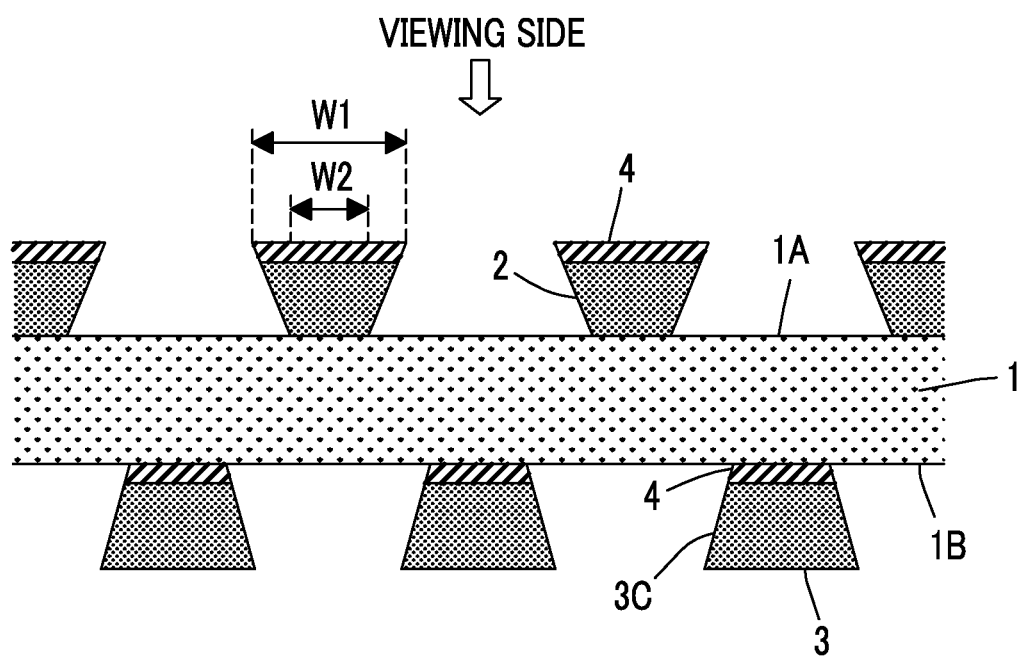

TRANSPARENT CONDUCTIVE FILM, METHOD OF PRODUCING TRANSPARENT CONDUCTIVE FILM, AND TOUCH PANEL

CROSS-REFERENCE TO RELATED APPLICATIONS.

This application is a Continuation of PCT International Application No. PCT/JP2015/077555 filed on Sep. 29, 2015, which claims priority under 35 U.S.C § 119(a) to Japanese Patent Application No. 2015-057648 filed on Mar. 20, 2015. Each of the above application(s) is hereby expressly incorporated by reference, in its entirety, into the present application.

BACKGROUND OF THE INVENTION

1. Field of the Invention

The present invention relates to a transparent conductive film and a method of producing the same, and particularly to a transparent conductive film used for a touch panel or the like and a method of producing the same.

In addition, the present invention relates to a touch panel using a transparent conductive film.

2. Description of the Related Art

In recent years, in various electronic devices such as a portable information device, a touch panel that can be used in combination with a display device such as a liquid crystal display device and performs an input operation to an electronic device by touching a screen has come into wide use.

For example, JP2013-206315A discloses a touch panel in which a first electrode formed of a stripped copper wiring is formed on a front surface of a transparent insulating substrate and a second electrode formed of a stripped copper wiring is formed on a rear surface of the transparent insulating substrate in a direction orthogonal to the copper wiring of the first electrode.

In the touch panel, specular reflection is reduced and contrast is improved by forming a blackened layer formed of a black copper oxide coating film at the end portion of the copper wiring which becomes a viewing side, in the case in which the touch panel is mounted in a display device or the like, out of both the copper wirings of the first electrode and the copper wiring of the second electrode. For example, in the case in which the first electrode formed on the front surface of the transparent insulating substrate is arranged on the viewing side, a blackened layer is formed at each of the end portion of the copper wiring of the first electrode on the side opposite to the transparent insulating substrate and the end portion of the copper wiring of the second electrode on the side close to the transparent insulating substrate.

SUMMARY OF THE INVENTION

In order to prevent the presence of a copper wiring having light shielding properties from being visually recognized and to reduce moire generated due to the interference of a pixel of a display device in which a touch panel is mounted with the copper wiring, the copper wiring which forms a first electrode and a second electrode needs to be thinned to a width of about 1 to 5 μm.

Such a copper wiring can be obtained by forming a copper foil on a transparent insulating substrate, and patterning the copper foil by a photolithography method using a resist. In this case, it is necessary to perform wet etching by causing the resist to adhere to the copper foil with high adhesion to perform patterning of a line width of about 1 to 5 μm with high accuracy. In this case, as shown in FIG. 9, copper wirings 2 and 3 each having a reversely tapered cross-sectional shape in which a line width W2 of the copper wiring on a side close to a transparent insulating substrate 1 is smaller than a line width W1 of the copper wiring on a side opposite to the transparent insulating substrate 1 are formed. At each of the end portions of the copper wirings 2 and 3 on the viewing side, a blackened layer 4 is formed.

However, as shown in FIG. 9, the stripped copper wirings 2 and 3 each having a line width of about 1 to 5 μm are formed on a front surface 1A and a rear surface 1B of the transparent insulating substrate 1. For example, in the case in which the transparent insulating substrate 1 is observed vertically from the front surface 1A side, there is a problem of viewing angle dependency in which the metallic luster of the copper wiring is noticeable according to the viewing angle in the case in which the transparent insulating substrate is oblique viewed.

It is found that this is because, since the respective copper wirings 2 and 3 have a reversely tapered cross-sectional shape, a side surface 3C of the copper wiring 3 formed on the rear surface 1B of the transparent insulating substrate 1 is easily viewed from the viewing side, and strong reflected light on the side surface 3C is changed according to the viewing angle.

As in the end portions of the copper wirings 2 and 3 on the viewing side, in the case in which the blackened layer 4 is formed, reflection can be reduced. However, it is difficult to form the blackened layer 4 on the side surface 3C of the copper wiring 3 due to the production process.

The present invention has been made to solve the above problems of the related art, and an object thereof is to provide a transparent conductive film capable of ensuring excellent visibility with low viewing angle dependency while forming an electrode formed of thin metal wires on each of a viewing side and a side opposite to the viewing side.

Another object of the present invention is to provide a method of producing a transparent conductive film capable of obtaining such a transparent conductive film.

Still another object of the present invention is to provide a touch panel using such a transparent conductive film.

A transparent conductive film according to the present invention is a transparent conductive film having a transmissive region comprising: a transparent insulating substrate having a first surface that is directed to a viewing side and a second surface that is directed to a side opposite to the viewing side; a first electrode formed of first thin metal wires arranged on the first surface of the transparent insulating substrate in the transmissive region; and a second electrode insulated from the first electrode and formed of second thin metal wires arranged on the second surface of the transparent insulating substrate to intersect the first thin metal wire in the transmissive region, in which the first thin metal wire has a first front surface being directed to the viewing side and having a line width W1A and a first back surface being directed to the side opposite to the viewing side and having a line width W1B, the second thin metal wire has a second front surface being directed to the viewing side and having a line width W2A and a second back surface being directed to the side opposite to the viewing side and having a line width W2B, and the line widths W1A, W1B, W2A, and W2B are in a range of 0.5 to 10 μm, and the line width W1A is larger than the line width W1B and the line width W2A is larger than the line width W2B.

It is preferable that the line widths W1A and W2A satisfy a relationship of $0 \leq W1A - W2A \leq 0.3 \times W1A$.

It is preferable that the line widths W1A, W1B, W2A, and W2B satisfy a relationship of W2A−W2B<W1A−W1B. In this case, it is more preferable that a thickness H2 of the second thin metal wire is larger than a thickness H1 of the first thin metal wire.

It is preferable that the line width W1A is 1.5 μm or more and 5 μm or less, and the thickness H1 of the first thin metal wire and the thickness H2 of the second thin metal wire are 0.5 μm or more and 3 μm or less.

In addition, the first front surface of the first thin metal wire and the second front surface of the second thin metal wire may be blackened layers.

It is preferable that the first thin metal wire and the second thin metal wire are formed of copper.

A method of producing a transparent conductive film according to the present invention is a method of producing the transparent conductive film comprising: forming a first metal layer on the first surface of the transparent insulating substrate and forming a second metal layer on the second surface of the transparent insulating substrate; forming a patterned first resist layer on a surface of the first metal layer and forming a patterned second resist layer on a surface of the second metal layer; performing an adhesion reinforcing treatment for further enhancing adhesion between the first metal layer and the first resist layer than between the second metal layer and the second resist layer by reinforcing adhesion between the first metal layer and the first resist layer; and forming the first thin metal wire and the second thin metal wire by performing wet etching on the first metal layer and the second metal layer respectively or simultaneously.

Another method of producing a transparent conductive film according to the present invention is a method of producing the transparent conductive film comprising: forming the first thin metal wire on the first surface of the transparent insulating substrate; forming the second thin metal wire on a surface of a transfer substrate; and transferring the second thin metal wire to the second surface of the transparent insulating substrate from the transfer substrate.

A touch panel according to the present invention is a touch panel using the transparent conductive film. As the touch panel, a projection type electrostatic capacitance touch panel that can detect multi-touch is preferable.

According to the present invention, since the first thin metal wire arranged on the first surface of the transparent insulating substrate has the first front surface being directed to the viewing side and having the line width W1A and the first back surface being directed to the side opposite to the viewing side and having the line width W1B, the second thin metal wire arranged on the second surface of the transparent insulating substrate has the second front surface being directed to the viewing side and having the line width W2A and the second back surface being directed to the side opposite to the viewing side and having the line width W2B, the line widths W1A, W1B, W2A, and W2B are in a range of 0.5 to 10 μm, the line width W1A is larger than the line width W1B and the line width W2A is larger than the line width W2B, it is possible to ensure excellent visibility with low viewing angle dependency while forming an electrode formed of thin metal wires on each of the viewing side and the side opposite to the viewing side.

BRIEF DESCRIPTION OF THE DRAWINGS

FIG. 1 is a partial cross-sectional view showing a touch panel according to Embodiment 1 of the present invention.

FIG. 2 is a plan view showing a transparent conductive film used for the touch panel according to Embodiment 1.

FIG. 9 is a partial cross-sectional view showing a first thin metal wire and a second thin metal wire of a transparent conductive film used for a conventional touch panel.

DESCRIPTION OF THE PREFERRED EMBODIMENTS

Embodiment 1

Figure 3:
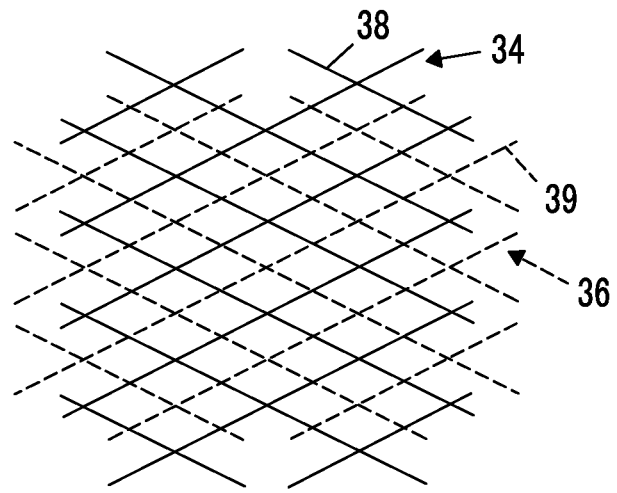
FIG. 3 is a partial plan view showing a detection electrode of the transparent conductive film used for the touch panel according to Embodiment 1.

FIG. 1 shows a configuration of a touch panel 11 according to Embodiment 1 of the present invention. The touch panel 11 has a transparent insulating cover panel 12 having a flat plate shape, and the transparent conductive film 13 is bonded to a surface of the cover panel 12 on a side opposite to a viewing side with a transparent adhesive 14. In the transparent conductive film 13, a conductive member 32 is formed on each of both surfaces of the transparent insulating substrate 31. In addition, as shown in FIG. 1, for the purpose of flattening or protecting the conductive member 32, a transparent protective layer 33 may be formed on both surfaces of the transparent insulating substrate 31 so as to cover the conductive member 32.

As the material for the cover panel 12, tempered glass, polycarbonate (PC), a polymethyl methacrylate resin (PMMA), or the like can be used and a thickness thereof is preferably 0.1 to 1.5 mm.

As the material for the transparent insulating substrate 31, glass, polyethylene terephthalate (PET), polyethylene naphthalate (PEN), a cycloolefin polymer (COP), a cyclic olefin copolymer (COC), or the like can be used, and a thickness thereof is preferably 20 to 200 μm.

As shown in FIG. 2, a transmissive region S1 is partitioned in the transparent conductive film 13, and a peripheral region S2 is partitioned on the outside of the transmissive region S1. On the front surface 31A of the transparent insulating substrate 31, a plurality of first electrodes 34 that respectively extend in a first direction D1, are arranged in parallel in a second direction D2 orthogonal to the first direction D1, and are formed of the conductive member 32 is formed in the transmissive region S1, and a plurality of first peripheral wirings 35 that are connected to the plurality of first electrodes 34 and are formed of the conductive member 32 is mutually closely arranged in the peripheral region S2.

Similarly, on the rear surface 31B of the transparent insulating substrate 31, a plurality of second electrodes 36 that respectively extend in the second direction D2, are arranged in parallel in the first direction D1, and are formed of the conductive member 32 is formed in the transmissive region Si, and a plurality of second first peripheral wirings 37 that are connected to the plurality of second electrodes 36 and are formed of the conductive member 32 is mutually closely arranged in the peripheral region S2.

FIG. 3 shows intersections of the first electrodes 34 and the second electrodes 36. The first electrodes 34 arranged on the front surface 31A of the transparent insulating substrate 31 are formed with a mesh pattern formed by the first thin metal wire 38, and the second electrodes 36 arranged on the rear surface 31B of the transparent insulating substrate 31 are also formed with a mesh pattern formed by the second thin metal wire 39. In the intersection of the first electrode 34 and the second electrode 36, in the case in which the transparent conductive film is viewed from the viewing side, the first thin metal wire 38 and the second thin metal wire 39 are arranged so as to intersect each other. In FIG. 3, in order to easily distinguish the first thin metal wire 38 and the second thin metal wire 39, the second thin metal wire 39 is indicated by a dotted line but is actually formed of a connected wire like the first thin metal wire 38.

As the shape of the mesh pattern, a pattern in which the same mesh is repeatedly arranged as shown in FIG. 3 is preferable and a diamond shape is particularly preferable as the mesh shape. However, the mesh shape may be a parallelogram shape, a square shape, a rectangular shape, or another polygonal shape. A distance between the centers of the meshes (mesh pitch) is preferably 100 to 600 µm from the viewpoint of visibility. It is preferable that a mesh pattern formed by the first thin metal wire 38 and a mesh pattern formed by the second thin metal wire 39 have the same shape. Further, as shown in FIG. 3, the mesh pattern formed by the first thin metal wire 38 and the mesh pattern formed by the second thin metal wire 39 are arranged to be shifted by a distance corresponding to half of the mesh pitch and are preferably arranged to form a mesh pattern with a half mesh pitch from the viewing side from the viewpoint of visibility. As another embodiment, the mesh shape may be a random pattern.

In addition, a dummy mesh pattern insulated from the electrodes respectively formed of the first thin metal wire 38 and the second thin metal wire 39 may be provided between the first electrodes 34 adjacent to each other and between the second electrodes 36 adjacent to each other. The dummy mesh pattern is preferably formed in the same mesh shape as the mesh pattern that forms the electrode.

Figure 4:
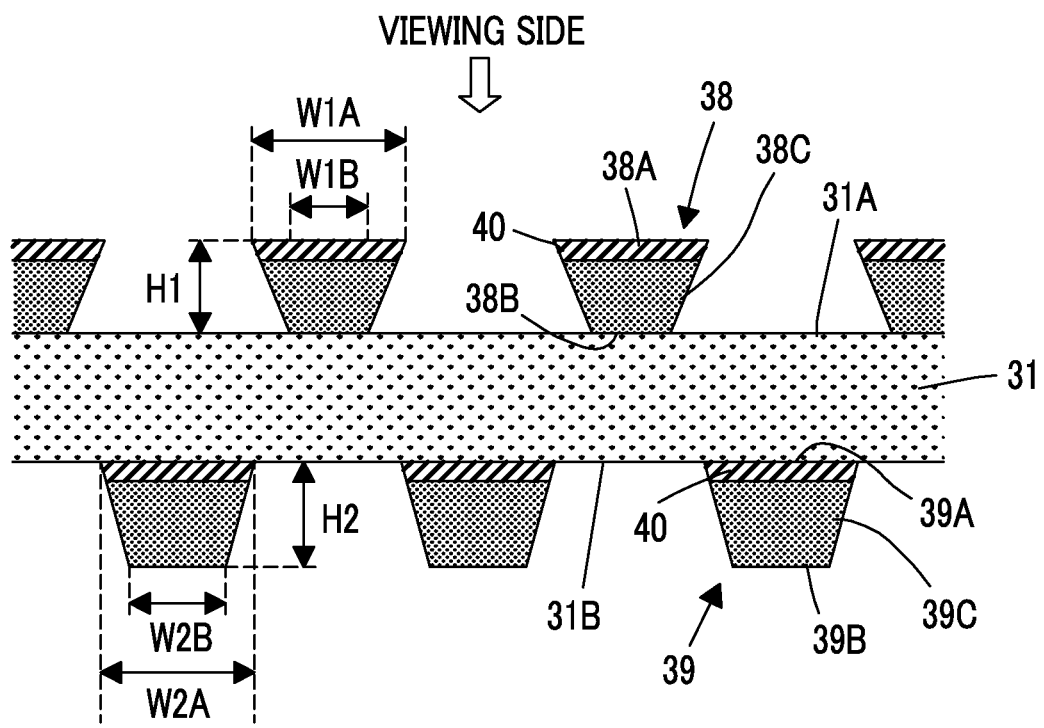
FIG. 4 is a partial cross-sectional view showing a first thin metal wire and a second thin metal wire of the transparent conductive film used for the touch panel according to Embodiment 1.

As shown in FIG. 4, the first thin metal wire 38 of the first electrode 34 arranged on the front surface 31A of the transparent insulating substrate 31 has a first front surface 38A that is directed to the viewing side and a first back surface 38B that is directed to the side opposite to the viewing side, and has a shape in which a line width W1A of the first front surface 38A is larger than a line width W1B of the first back surface 38B, a so-called reversely tapered cross-sectional shape.

On the other hand, the second thin metal wire 39 of the second electrode 36 arranged on the rear surface 31B of the transparent insulating substrate 31 has a second front surface 39A that is directed to the viewing side and a second back surface 39B that is directed to the side opposite to the viewing side, and has a shape in which a line width W2B of the second back surface 39B is smaller than a line width W2A of the second front surface 39A, a so-called forward tapered cross-sectional shape.

That is, the line widths W1A and W1B of the first thin metal wire 38 and the line widths W2A and W2B of the second thin metal wire 39 satisfy a relationship of $$W1B<W1A \text{ and } W2B<W2A \qquad (1).$$

In addition, the line widths W1A, W1B, W2A, and W2B of the first thin metal wire 38 and the second thin metal wire 39 are all set to be in a range of 0.5 to 10 µm so that the first thin metal wire and the second thin metal wire are hardly visually recognized.

With this configuration, a side surface 39C of the second thin metal wire 39 arranged on the rear surface 31B of the transparent insulating substrate 31 is hardly viewed and thus the viewing angle dependency of metallic luster of the first electrode 34 and the second electrode 36 is improved.

In addition, a blackened layer 40 is formed on each of the first front surface 38A of the first thin metal wire 38 on the viewing side and the second front surface 39A of the second thin metal wire 39 on the viewing side. The blackened layer 40 is provided to reduce specular reflection on the first front surface 38A of the first thin metal wire 38 and the second front surface 39A of the second thin metal wire 39. It is difficult to form the blackened layer 40 on the side surface 38C of the first thin metal wire 38 and the side surface 39C of the second thin metal wire 39, but it is preferable that the blackened layer 40 is formed on the front surfaces.

As the material for the first thin metal wire 38 and the second thin metal wire 39, metals such as copper, silver, aluminum, gold, and molybdenum or alloys thereof may be used and a film thickness thereof is preferably 0.1 to 5 µm. Among these, copper is preferable from the viewpoint of a low resistance value, stability, and costs.

In FIG. 4, the transparent insulating substrate 31 and the first thin metal wire 38 or the second thin metal wire 39 are directly in contact with each other. However, one or more layers of functional layers, such as an adhesion reinforcing layer, an undercoat layer, or a hard coat layer, can be formed between the transparent insulating substrate 31 and the first thin metal wire 38 or the second thin metal wire 39.

For the blackened layer 40, an oxide including copper is preferably used, and copper oxide (II) (CuO), CuO—$Cr_2O_3$, CuO—$Fe_3O_4$—$Mn_2O_3$, CuO—$Fe_2O_3$—$Cr_2O_3$, and the like may be used. As other materials, black iron oxide ($Fe_3O_4$), titanium black, nickel, chromium or the like may be used and a film thickness thereof is preferably 0.01 to 0.4 µm.

In addition, in the case in which light shielding members having the same line width are respectively arranged on the front and rear surfaces of a transparent plate and the transparent plate is observed from the front surface side, the light shielding member on the rear surface side is viewed using light refracted on the front surface of the transparent plate, and thus, it is found that the width of the light shielding member arranged on the rear surface looks larger than the width of the light shielding member arranged on the front surface.

Therefore, it is preferable that the line width W1A of the first front surface 38A of the first thin metal wire 38 arranged on the front surface 31A of the transparent insulating substrate 31 is set to have a value slightly larger than the line width W2A of the second front surface 39A of the second thin metal wire 39 arranged on the rear surface 31B of the transparent insulating substrate 31 in advance.

However, in order to prevent the presence of the first thin metal wire 38 and the second thin metal wire 39 from being noticeable due to a difference in line width between the first thin metal wire 38 and the second thin metal wire 39 in the case in which the transparent conductive film is viewed from the viewing side, a difference between the line width W1A of the first front surface 38A of the first thin metal wire 38 and the line width W2A of the second front surface 39A of the second thin metal wire 39 (W1A−W2A) is desirably equal to or less than a value 0.3 times the line width W1A. That is, it is desirable that the line widths W1A and W2A satisfy a relationship of $$0 \leq W1A - W2A \leq 0.3 \times W1A \qquad (2).$$

By respectively arranging such first thin metal wire 38 and second thin metal wire 39 on the front surface 31A and on the rear surface 31B of the transparent insulating substrate 31, out of the front surface 31A and the rear surface 31B of the transparent insulating substrate 31, the line width W1A of the first front surface 38A of the first thin metal wire 38 on the viewing side arranged on the front surface 31A positioned on the viewing side is set to be equal to the line width W2A of the second front surface 39A of the second thin metal wire 39 on the viewing side arranged on the rear surface 31B positioned on the side opposite to the viewing side or is set to have a value slightly larger than the line width W2A. Thus, in the case in which the transparent conductive film 13 is observed from the viewing side, the first thin metal wire 38 on the front surface 31A of the transparent insulating substrate 31 and the second thin metal wire 39 on the rear surface 31B seem to have the same line width. Accordingly, the presence of the mesh pattern of the first electrode 34 formed of the first thin metal wire 38 and the second electrode 36 formed of the second thin metal wire 39 is hardly visually recognized and thus the visibility of the transmissive region S1 of the transparent conductive film 13 is improved. As a particularly preferable range, the line width W1A is slightly larger than the line width W2A, and a difference between the line widths is preferably 0.02 μm or more and a relationship of 0.02 μm≤W1A−W2A≤0.3×W1A is satisfied.

In addition, in the case in which the transparent conductive film is viewed from the viewing side, the tapered shape of the side surface 39C of the second thin metal wire 39 having a forward tapered cross-sectional shape that is arranged on the rear surface 31B of the transparent insulating substrate 31 becomes loose, and in the case in which the transparent conductive film 13 is obliquely viewed, there is a high possibility that reflected light may be observed on the side surface 39C.

It is desirable that a difference between the line width W2A of the second front surface 39A and the line width W2B of the second back surface 39B of the second thin metal wire 39 (W2A−W2B) is smaller than a difference between the line width W1A of the first front surface 38A and the line width W1B of the first back surface 38B of the first thin metal wire 38 (W1A−W1B) so that the side surface 39C of the second thin metal wire 39 on the rear surface 31B side of the transparent insulating substrate 31 is hardly viewed. That is, it is desirable that the line widths W1A and W1B of the first thin metal wire 38 and the line widths W2A and W2B of the second thin metal wire 39 satisfy a relationship of $$W2A - W2B < W1A - W1B \qquad (3).$$

In this manner, the influence of reflected light according to the viewing angle can be further reduced and thus viewing angle dependency can be more effectively reduced.

The first thin metal wire 38 having a reversely tapered cross-sectional shape and the second thin metal wire 39 having a forward tapered cross-sectional shape can be formed by performing wet etching on metal layers of copper or the like respectively formed on both surfaces of the transparent insulating substrate 31. However, in order to realize the configuration represented by Expression (3), it is preferable that a thickness H2 of the second thin metal wire 39 has a larger value than a thickness H1 of the first thin metal wire 38. This is because, in the case in which metals having different thicknesses are subjected to wet etching simultaneously, the time during which the metal having a smaller thickness is over-etched becomes longer, a reversely tapered shape is tightly formed, and thus, the shape satisfying the above condition is easily formed.

Specifically, it is desirable for the transparent conductive film 13 used for the touch panel 11 to set the line width W1A of the first front surface 38A of the first thin metal wire 38 to 1.5 μm or more and 5 μm or less and to set the thickness H1 of the first thin metal wire 38 and the thickness H2 of the second thin metal wire 39 to 0.5 μm or more and 3 μm or less. By setting the thicknesses of the first thin metal wire 38 and the second thin metal wire 39 to 0.5 μm or more and 3 μm or less, a thin metal wire having a line width of 1.5 μm or more and 5 μm or less is easily formed. Particularly, by setting the thickness of the thin metal wire to a value equal to or less than half of the line width, a thin metal wire is easily formed by performing wet etching on a metal wire having a fine line width of 5 μm or less. Further, it is preferable that the line width W1A of the first front surface 38A of the first thin metal wire 38 is 2 μm or more and 4 μm or less, and the thickness H1 of the first thin metal wire 38 and the thickness H2 of the second thin metal wire 39 are 0.5 μm or more and 2 μm or less in consideration of production suitability.

The blackened layer 40 for reducing specular reflection can be formed of copper oxide, in the case of using copper as the material for forming the first thin metal wire 38 and the second thin metal wire 39, for example.

The formation of the blackened layer 40 reduces specular reflection on the first front surface 38A of the first thin metal wire 38 and the second front surface 39A of the second thin metal wire 39 that are respectively positioned on the viewing side so as to improve contrast.

The transparent conductive film 13 is produced by forming the conductive member 32 including the first electrode 34 and the first peripheral wiring 35 on the front surface 31A of the transparent insulating substrate 31 and forming the conductive member 32 including the second electrode 36 and the second peripheral wiring 37 on the rear surface 31B of the transparent insulating substrate 31.

The conductive member 32 can be formed as follows.

Figure 5A:
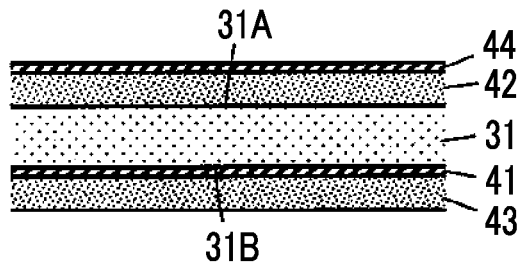
FIGS. 5A to 5F are cross-sectional views showing the step procedure of a method of producing the touch panel according to Embodiment 1.

For example, as shown in FIG. 5A, a blackened layer 41 formed of copper oxide is formed on the rear surface 31B of the transparent insulating substrate 31 and then a first metal layer 42 and a second metal layer 43 each formed of copper are formed on the front surface 31A of the transparent insulating substrate 31 and on the blackened layer 41 of the rear surface 31B. Further, a blackened layer 44 formed of copper oxide is formed on the first metal layer 42 of the front surface 31A of the transparent insulating substrate 31.

Figure 5B:
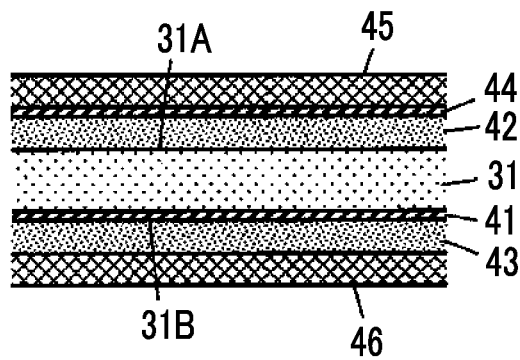
Figure 5C:
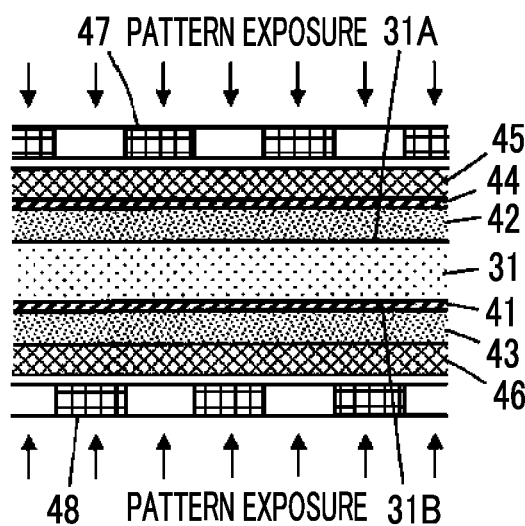
Figure 5D:
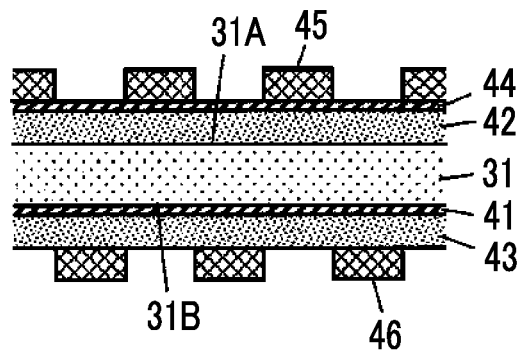

Next, as shown in FIG. 5B, a first resist layer 45 and a second resist layer 46 are respectively formed on the blackened layer 44 of the front surface 31A of the transparent insulating substrate 31 and the second metal layer 43 of the rear surface 31B, and as shown in FIG. 5C, the first resist layer 45 and the second resist layer 46 are respectively subjected to pattern exposure through a first exposure mask 47 and a second exposure mask 48 and developed. As shown in FIG. 5D, the patterned first resist layer 45 and second resist layer 46 are respectively patterned.

At this time, it is preferable that both surfaces of the first resist layer 45 and the second resist layer 46 are exposed simultaneously. The pattern of the first thin metal wire 38 and the pattern of the second thin metal wire 39 can be aligned with high accuracy by simultaneous exposing both surfaces.

Figure 5E:
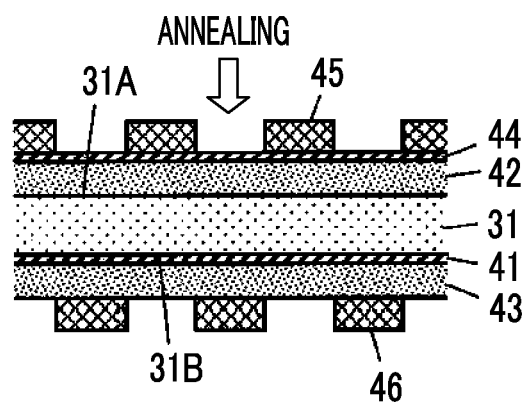

Then, as shown in FIG. 5E, only the first resist layer 45 on the front surface 31A side of the transparent insulating substrate 31 is subjected to an annealing treatment or the like using a halogen lamp or the like and adhesion between the first metal layer 42 and the blackened layer 44, and the first resist layer 45 is reinforced to further enhancing adhesion between the first metal layer and the first resist layer than the second metal layer 43 and the second resist layer 46.

Figure 5F:
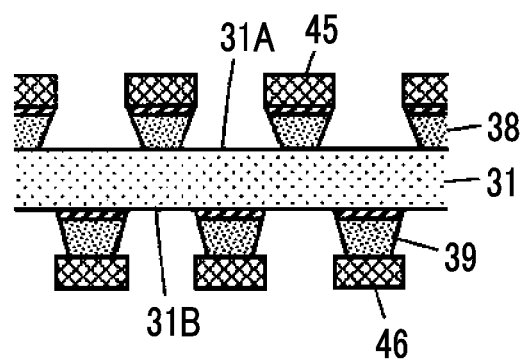

In this state, in the case in which the first metal layer 42 and the second metal layer 43 are respectively subjected to wet etching using an etching solution, since the first resist layer 45 is firmly bonded to the front surface 31A side of the transparent insulating substrate 31, the etching solution is prevented from permeating between the first metal layer 42 and the blackened layer 44, and the first resist layer 45 and a portion that is close to the transparent insulating substrate 31 is etched more than a portion that is directed to the first resist layer 45 in the first metal layer 42 as the etching time elapses. Thus, a first thin metal wire 38 having a reversely tapered shape is formed as shown in FIG. 5F.

On the other hand, since the second resist layer 46 has a relatively low adhesion on the rear surface 31B of the transparent insulating substrate 31, the etching solution permeates between the second metal layer 43 and the second resist layer 46 and a portion that is directed to the second resist layer 46 is etched more than a portion close to the transparent insulating substrate 31 in the second metal layer 43 as the etching time elapses. Thus, a second thin metal wire 39 having a forward tapered shape is formed as shown in FIG. 5F.

Then, the transparent conductive film 13 having the structure shown in FIG. 4 can be obtained by removing the first resist layer 45 and the second resist layer 46.

Alternatively, the conductive member 32 can be formed as follows.

Figure 6A:
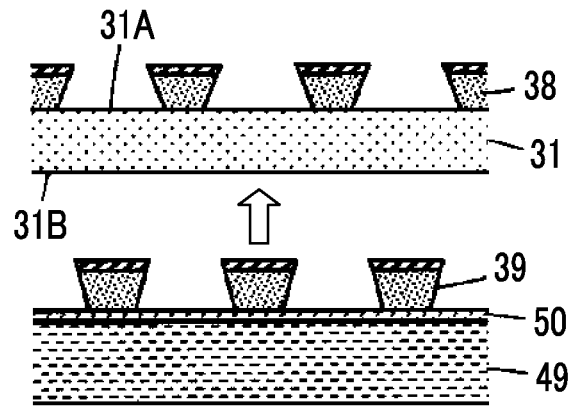
FIGS. 6A to 6C are cross-sectional views showing the step procedure of another method of producing the touch panel according to Embodiment 1.

First, as in the method shown in FIGS. 5A to 5F, a first metal layer formed of copper is formed on the front surface 31A of the transparent insulating substrate 31, and then a blackened layer formed of copper oxide is formed on the first metal layer. A patterned resist is formed on the blackened layer to perform wet etching. Then, as shown in FIG. 6A, a first thin metal wire 38 having a reversely tapered shape is formed on the front surface 31A of the transparent insulating substrate 31.

Further, a release layer 50 is formed on the surface of the transfer substrate 49 in the same manner, and then a second metal layer formed of copper and a blackened layer formed of copper oxide are sequentially formed on the release layer 50. A patterned resist is formed on the blackened layer to perform wet etching. Thus, as shown in FIG. 6A, a second thin metal wire 39 having a reversely tapered shape is formed on the release layer 50.

Figure 6B:
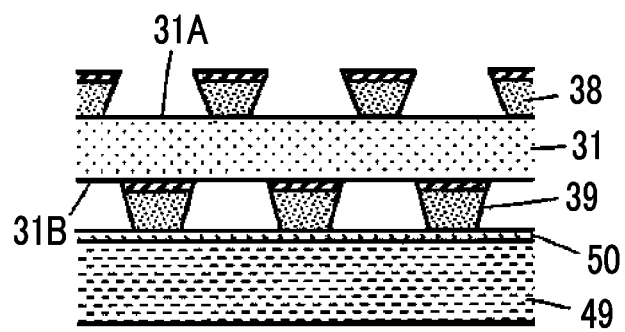
Figure 6C:
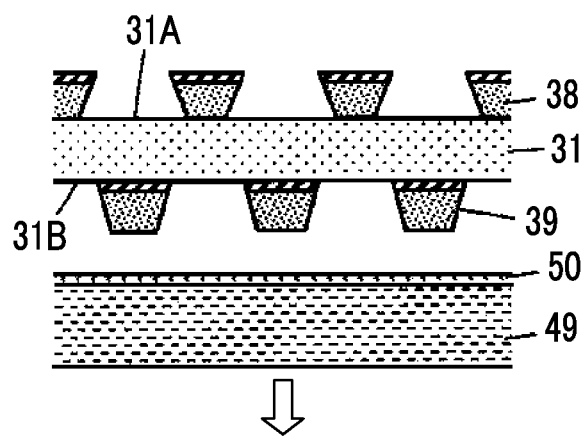

As shown in FIG. 6B, the second thin metal wire 39 formed on the surface of the transfer substrate 49 is attached to the rear surface 31B of the transparent insulating substrate 31 through a pressure sensitive adhesive layer and transferred to the transparent insulating substrate and then as shown in FIG. 6C, the transfer substrate 49 and the release layer 50 are separated from the second thin metal wire 39. Thus, the second thin metal wire 39 having a forward tapered shape is arranged on the rear surface 31B of the transparent insulating substrate 31.

Embodiment 2

Figure 7:
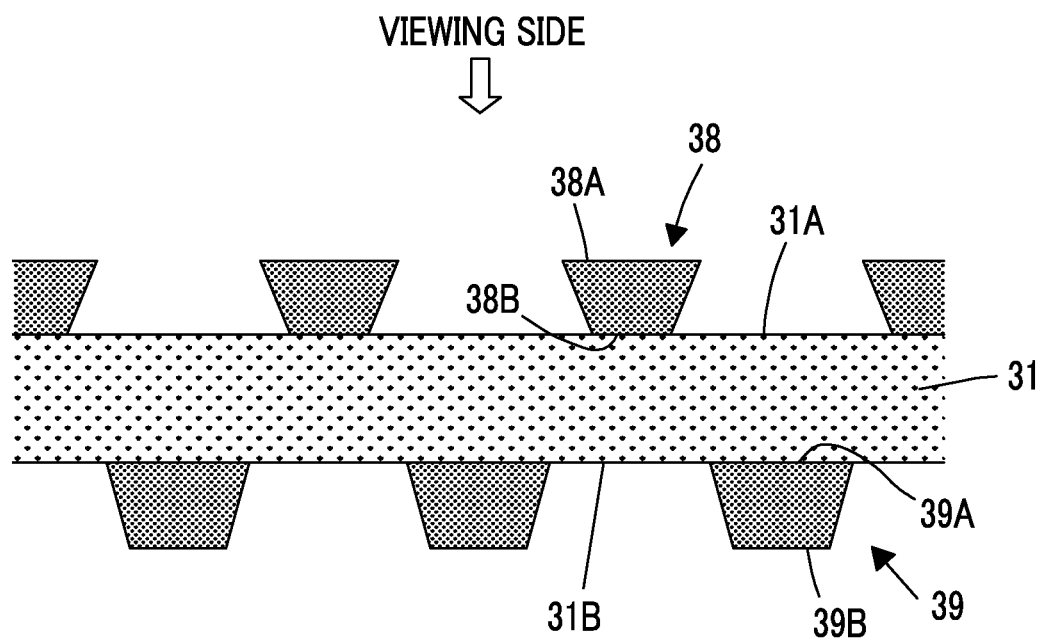
FIG. 7 is a partial cross-sectional view showing a first thin metal wire and a second thin metal wire of a transparent conductive film used for a touch panel according to Embodiment 2.

The transparent conductive film 13 used for the touch panel 11 of Embodiment 1 has the blackened layers 40 respectively formed on the first front surface 38A of the first thin metal wire 38 on the viewing side and on the second front surface 39A of the second thin metal wire 39 on the viewing side, but the present invention is not limited thereto. For example, as shown in FIG. 7, the first thin metal wire 38 and the second thin metal wire 39 may not have the blackened layers 40.

Even in this case, as long as all of the line widths W1A and W1B of the first thin metal wire 38 and the line widths W2A and W2B of the second thin metal wire 39 are set to be in a range of 0.5 to 10 μm and satisfy the above relationship represented by Expression (1), excellent visibility with low viewing angle dependency can be ensured.

In addition, the line width W1A of the first thin metal wire 38 and the line width W2A of the second thin metal wire 39 further satisfy the above relationship represented by Expression (2) and thus visibility can be further improved. As long as the line widths W1A and W1B of the first thin metal wire 38 and the line widths W2A and W2B of the second thin metal wire 39 satisfy the above relationship represented by Expression (3), viewing angle dependency can be further reduced.

Embodiment 3

Figure 8:
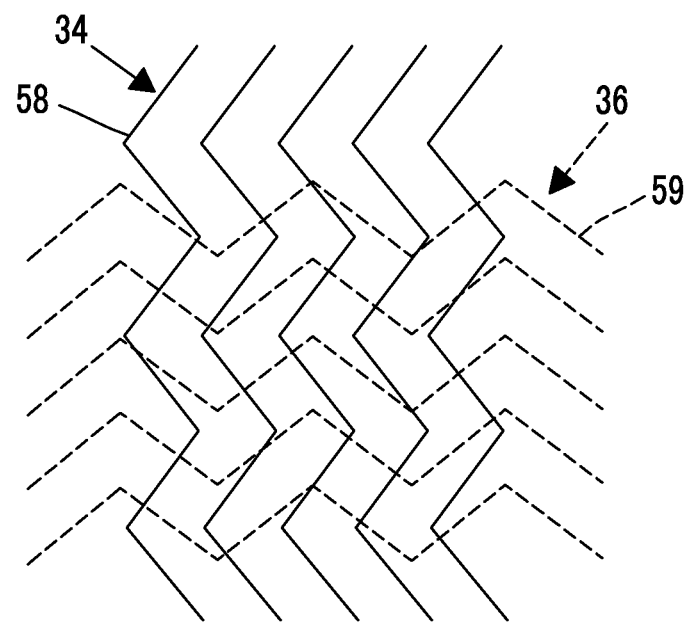
FIG. 8 is a partial plan view showing a detection electrode of a transparent conductive film used for a touch panel according to Embodiment 3.

In Embodiments 1 and 2, as shown in FIG. 3, the first thin metal wire 38 of the first electrode 34 arranged on the front surface 31A of the transparent insulating substrate 31 and the second thin metal wire 39 of the second electrode 36 arranged on the rear surface 31B of the transparent insulating substrate 31 respectively have a mesh pattern, but the present invention is not limited thereto. For example, the transparent conductive film can also be configured such that as shown in FIG. 8, the first electrodes 34 are formed of a plurality of first thin metal wires 58 that are respectively bent and parallel with one another, the second electrodes 36 are formed of a plurality of second thin metal wires 59 that are respectively bent and parallel with one another, and in the case in which the transparent conductive film is viewed from the viewing side, the plurality of first thin metal wires 58 and the plurality of second thin metal wires 59 overlap each other to form a large number of meshes of polygons. In this case, it is preferable that a distance between adjacent first thin metal wires and a distance between adjacent second thin metal wires are 50 to 300 μm from the viewpoint of visibility.

In the case in which such first thin metal wire 58 and second thin metal wire 59 are used, it is possible to ensure excellent visibility with low viewing angle dependency as in Embodiments 1 and 2.

In FIG. 8, as in FIG. 3, in order to easily distinguish the first thin metal wire 58 and the second thin metal wire 59, the second thin metal wire 59 is indicated by a dotted line but is actually formed of a connected wire like the first thin metal wire 58.

It is optimum to use the transparent conductive film according to the present invention for the touch panel shown in FIG. 1. However, the transparent conductive film can be additionally applied to a heat generator for generating heat, an electromagnetic wave shield for shielding electromagnetic wave, and the like.

EXAMPLES

Hereinafter, the present invention is further specifically described based on examples. Materials, used amounts, ratios, the contents of treatments, the treatment procedures, and the like illustrated in the following examples may be appropriately changed unless the change departs from the spirit of the present invention. Thus, the scope of the present invention should not be interpreted in a limited manner based on the examples illustrated below.

Example 1

As shown below, transparent conductive films having the configurations shown in FIGS. 2 to 4 were produced.

First, a polyethylene terephthalate (PET) film having a thickness of 100 µm was prepared as a transparent insulating substrate and an undercoat layer having a thickness of 5 µm was formed on both surfaces of the transparent insulating substrate by using a polyester resin. Further, an adhesion reinforcing layer having a thickness of 100 nm was formed on these undercoat layers using silicon oxide formed by a sol-gel method.

Next, a blackened layer formed of copper oxide and having a thickness of 0.1 µm was formed on the adhesion reinforcing layer positioned on the rear surface of the transparent insulating substrate on the side opposite to the viewing side by sputtering. Further, a copper layer having a thickness of 0.9 µm was formed on the adhesion reinforcing layer on the front surface side of the transparent insulating substrate and a copper layer having a thickness of 1.4 µm was formed on the blackened layer on the rear surface side by sputtering and a blackened layer formed of copper oxide and having a thickness of 0.1 µm was formed on the copper layer on the front surface side by sputtering. Thus, a laminate in which the copper layer with the blackened layer was arranged on each of the front surface and the rear surface of the transparent insulating substrate was formed.

A resist was applied to each of the front surface and the rear surface of the laminate, and pre-baking was performed at a temperature of 80° C. for 30 minutes. Pattern exposure was performed on the resists on the front surface and the rear surface of the laminate through respective first exposure mask and second exposure mask made of quartz using ultraviolet rays while exposing both surfaces simultaneously. After the exposure, the resists were developed with alkali and patterned. Then, post-baking was performed at a temperature of 90° C. for 15 minutes and only the resist on the front surface side of the laminate was further subjected to an annealing treatment using a halogen lamp to reinforce the adhesion of the resist on the front surface side of the laminate. Thus, the adhesion of the resist on the front surface side of the laminate was made stronger than the adhesion of the resist on the rear surface side of the laminate.

The patterns on both surfaces of the laminate adopted a diamond-like mesh shape that is a mesh shape as shown in FIG. 3 and has a mesh pitch of 400 µm on each of the front surface and the rear surface of the laminate and a narrow angle of the intersecting angle of 60 degrees. A line width M1 of a first exposure mask for the first thin metal wire on the viewing side was set to 3.0 µm and a line width M2 of a second exposure mask for the second thin metal wire on the side opposite to the viewing side was also set to 3.0 µm.

With respect to the laminate having the patterned resists, copper and copper oxide on both surfaces of the laminate were etched simultaneously by wet etching using an etching solution of an aqueous solution of iron (III) chloride at a temperature of 40° C.

Then, the resists were peeled off from both surfaces of the laminate, and the laminate was washed with water and dried. Thus, a transparent conductive film of Example 1 was produced.

Examples 2 and 3

Transparent conductive films of Examples 2 and 3 were respectively produced in the same manner as in Example 1 except that the line width M2 of the second exposure mask for the second thin metal wire on the side opposite to the viewing side was set to 2.5 µm and 2.2 µm.

Example 4

A transparent conductive film of Example 4 was produced in the same manner as in Example 1 except that the line width M1 of the first exposure mask for the first thin metal wire on the viewing side was set to 4.0 µm, and the line width M2 of the second exposure mask for the second thin metal wire on the side opposite to the viewing side was set to 4.0 µm.

Examples 5 and 6

Transparent conductive films of Examples 5 and 6 were respectively produced in the same manner as in Example 4 except that the line width M2 of the second exposure mask for the second thin metal wire on the side opposite to the viewing side was set to 3.5 µm and 3.2 µm.

Example 7

A transparent conductive film of Example 7 was produced in the same manner as in Example 1 except that the thickness of the copper layer of the transparent insulating substrate on the viewing side was changed to 1.9 µm, the thickness of the copper layer on the side opposite to the viewing side was changed to 2.9 µm, the line width M1 of the first exposure mask for the first thin metal wire on the viewing side was set to 5.0 µm, and the line width M2 of the second exposure mask for the second thin metal wire on the side opposite to the viewing side was set to 5.0 µm.

Examples 8 and 9

Transparent conductive films of Examples 8 and 9 was respectively produced in the same manner as in Example 7 except that the line width M2 of the second exposure mask for the second thin metal wire on the side opposite to the viewing side was set to 3.5 µm and 3.2 µm.

Example 10

A transparent conductive film of Example 10 was produced in the same manner as in Example 4 except that the thickness of the copper layer of the transparent insulating substrate on the viewing side was changed to 0.4 µm and the thickness of the copper layer on side opposite to the viewing side was changed to 1.4 µm.

Example 11

A transparent conductive film of Example 11 was produced in the same manner as in Example 4 except that the thickness of the copper layer of the transparent insulating substrate on the viewing side was changed to 0.7 μm and the thickness of the copper layer on side opposite to the viewing side was changed to 1.4 μm.

Example 12

First, a polyethylene terephthalate (PET) film having a thickness of 100 μm was prepared as a transparent insulating substrate, and an undercoat layer having a thickness of 5 μm was formed on both surfaces of the transparent insulating substrate using a polyester resin. Further, an adhesion reinforcing layer having a thickness of 100 nm was formed on the undercoat layer positioned on the front surface of the transparent insulating substrate on the viewing side using silicon oxide formed by a sol-gel method.

Next, a copper layer having a thickness of 0.9 μm and a blackened layer formed of copper oxide and having a thickness of 0.1 μm were sequentially formed on the adhesion reinforcing layer by sputtering and the copper layer with the blackened layer was formed on the front surface of the transparent insulating substrate.

Further, a resist was applied to the blackened layer and pre-baking was performed at a temperature of 80° C. for 30 minutes. Pattern exposure was performed on the resist through a first exposure mask made of quartz using ultraviolet rays. After the exposure, the resist was developed with alkali and patterned. Then, post-baking was performed at a temperature of 120° C. for 1 hour to reinforce the adhesion of the resist.

As the pattern, a diamond-like mesh pattern that is a mesh pattern as shown in FIG. 3 and has a mesh pitch of 400 μm and a narrow angle of the intersecting angle of 60 degrees was adopted and a line width M1 of the first exposure mask was set to 3.0 μm.

The copper layer with the blackened layer in which the patterned resist was arranged was etched by wet etching using an etching solution of an aqueous solution of iron (III) chloride at a temperature of 40° C.

Then, the resist was peeled off and the substrate was washed with water and dried. Thus, a first thin metal wire having a reversely tapered shape was formed on the front surface of the transparent insulating substrate.

Next, a release layer formed of polyolefin was formed on a surface of a transfer substrate made of glass and then a copper layer having a thickness of 0.9 μm and a blackened layer having a thickness of 0.1 μm and formed of a copper oxide were sequentially formed on the release layer. Thus, the copper layer with the blackened layer was formed on the surface of the transfer substrate.

A resist was applied to the blackened layer and pre-baking was performed at a temperature of 80° C. for 30 minutes. Pattern exposure was performed on the resist through a second exposure mask made of quartz using ultraviolet rays. After the exposure, the resist was developed with alkali and patterned. Then, post-baking was performed at a temperature of 120° C. for 1 hour to reinforce the adhesion of the resist.

As the pattern, a diamond-like mesh pattern that is a mesh pattern as shown in FIG. 3 and has a mesh pitch of 400 μm and a narrow angle of the intersecting angle of 60 degrees was adopted and a line width M2 of the second exposure mask was set to 2.5 μm.

The copper layer with the blackened layer in which the patterned resist was arranged was etched by wet etching using an etching solution of an aqueous solution of iron (III) chloride at a temperature of 40° C.

Then, the resist was peeled off and the substrate was washed with water and dried. Thus, a second thin metal wire having a reversely tapered shape was formed on the surface of the transfer substrate.

The second thin metal wire formed on the surface of the transfer substrate was attached to the rear surface of the transparent insulating substrate on the side opposite to the viewing side through a pressure sensitive adhesive layer and irradiation with ultraviolet rays was performed through the transfer substrate. The second thin metal wire was transferred to the rear surface of the transparent insulating substrate and the transfer substrate was peeled off from the second thin metal wire. Thus, a transparent conductive film of Example 12 in which the second thin metal wire having a forward tapered shape on the rear surface of the transparent insulating substrate was arranged was produced.

Comparative Example 1

A transparent conductive film of Comparative Example 1 was produced in the same manner as in Example 1 except that the thickness of the copper layer of the transparent insulating substrate on the side opposite to the viewing side was set to 1 μm, the conditions for post-baking was changed to a temperature of 120° C. for 1 hour, and further an annealing treatment using a halogen lamp was not performed.

Comparative Example 2

A transparent conductive film of Comparative Example 2 was produced in the same manner as in Example 1 except that the line width M1 of the first exposure mask and the line width M2 of the second exposure mask were respectively set to 4.0 μm.

Comparative Example 3

A transparent conductive film of Comparative Example 3 was produced in the same manner as in Example 1 except that the thickness of the copper layer of the transparent insulating substrate on the viewing side and the thickness of the copper layer of the transparent insulating substrate on the side opposite to the viewing side were respectively set to 1.9 μm.

The cross section of each of the transparent conductive films of Examples 1 to 12 and Comparative Examples 1 to 3 was observed using an electron microscope and shown in FIG. 4, and the line width W1A of the first front surface 38A of the first thin metal wire 38 that was directed to the viewing side, the line width W1B of the first back surface 38B that was directed to the side opposite to the viewing side, the line width W2A of the second front surface 39A of the second thin metal wire 39 that was directed to the side opposite to the viewing side, and the line width W2B of the second back surface 39B that was directed to the side opposite to the viewing side were measured.

In addition, the viewing angle and the mesh visibility of each of the transparent conductive films of Examples 1 to 12 and Comparative Examples 1 to 3 were evaluated.

The measurement results and evaluation results thereof are shown in Table 1.

TABLE 1

| | Mask design value (μm) | | Measured value (μm) | | | | | | Evaluation result | |
|---|---|---|---|---|---|---|---|---|---|---|
| | M1 | M2 | W1A | W1B | H1 | W2A | W2B | H2 | Viewing angle | Mesh visibility |
| EXAMPLE 1 | 3.00 | 3.00 | 2.98 | 2.06 | 1.0 | 2.99 | 3.96 | 1.5 | B | B |
| EXAMPLE 2 | 3.00 | 2.50 | 2.96 | 2.01 | 1.0 | 2.56 | 3.52 | 1.5 | B | A |
| EXAMPLE 3 | 3.00 | 2.20 | 2.98 | 2.04 | 1.0 | 2.28 | 3.22 | 1.5 | B | A |
| EXAMPLE 4 | 4.00 | 4.00 | 3.96 | 3.01 | 1.0 | 4.08 | 3.10 | 1.5 | B | B |
| EXAMPLE 5 | 4.00 | 3.50 | 3.98 | 3.04 | 1.0 | 3.62 | 2.64 | 1.5 | B | A |
| EXAMPLE 6 | 4.00 | 3.20 | 3.98 | 3.06 | 1.0 | 3.34 | 2.26 | 1.5 | B | A |
| EXAMPLE 7 | 5.00 | 5.00 | 5.01 | 2.98 | 2.0 | 5.11 | 2.96 | 3.0 | B | B |
| EXAMPLE 8 | 5.00 | 3.50 | 4.96 | 2.96 | 2.0 | 3.68 | 1.42 | 3.0 | B | A |
| EXAMPLE 9 | 5.00 | 3.20 | 4.98 | 2.99 | 2.0 | 3.25 | 1.18 | 3.0 | B | B |
| EXAMPLE 10 | 4.00 | 4.00 | 3.98 | 1.98 | 0.5 | 3.96 | 3.12 | 1.5 | A | A |
| EXAMPLE 11 | 4.00 | 4.00 | 3.96 | 2.45 | 0.8 | 3.95 | 3.11 | 1.5 | A | A |
| EXAMPLE 12 | 3.00 | 2.50 | 2.98 | 2.06 | 1.0 | 2.58 | 1.93 | 1.0 | A | A |
| COMPARATIVE EXAMPLE 1 | 3.00 | 3.00 | 3.01 | 2.08 | 1.0 | 2.10 | 2.98 | 1.0 | C | C |
| COMPARATIVE EXAMPLE 2 | 4.00 | 4.00 | 3.99 | 3.04 | 1.0 | 2.98 | 3.96 | 1.0 | C | C |
| COMPARATIVE EXAMPLE 3 | 5.00 | 5.00 | 4.99 | 3.01 | 2.0 | 2.96 | 4.98 | 2.0 | C | C |

The evaluation of the viewing angle was performed such that the transparent conductive film was arranged on a horizontal black plate so that the second thin metal wire was placed on the black plate side (on the side opposite to the viewing side), white light was emitted to the transparent conductive film from the upper side, and the transparent conductive film was visually observed at a height of 20 cm from the transparent conductive film and two kinds of angles of 50 degrees and 30 degrees respectively to evaluate whether or not the metallic luster of the transparent conductive film was observed.

In Table 1, the evaluation result A in the evaluation of the viewing angle refers to a level having an excellent viewing angle at which the metallic luster is not observed at both angles of 50 degrees and 30 degrees, the evaluation result B refers to a level having no problem at which while metallic luster is not observed at an angle of 50 degrees, the metallic luster is slightly observed at an angle of 30 degrees, and the evaluation result C refers to a level having a problem in viewing angle at which the metallic luster is observed at both angles of 50 degrees and 30 degrees, respectively.

The evaluation of the mesh visibility was performed such that the transparent conductive film was arranged on a horizontal black plate so that the second thin metal wire was placed on the black plate side (on the side opposite to the viewing side), white light was emitted to the transparent conductive film from the upper side, and the transparent conductive film was observed at a depression angle of 45 degrees at two points of an observation point at a height of 40 cm from the transparent conductive film and an observation point at a height of 10 cm from the transparent conductive film, respectively, to evaluate whether or not the mesh pattern was observed.

In Table 1, the evaluation result A in the evaluation of the mesh visibility refers to a level exhibiting excellent visibility at which no mesh pattern is observed at both the observation point at a height of 40 cm and the observation point at a height of 10 cm, and the evaluation result B refers to a level having no practical problem in visibility at which while the mesh pattern is not observed at the observation point at a height of 40 cm, the mesh pattern is slightly observed at the observation point at a height of 10 cm, respectively. In contrast, the evaluation result C refers to a level having a problem in visibility at which the presence of the first thin metal wire is noticeable at both the observation point at a height of 40 cm, the observation point at a height of 10 cm and the mesh pattern is apparently observed.

Regarding all of the transparent conductive films of Examples 1 to 12 satisfying the relationship of Expression (1), that is, W1B<W1A and W2B<W2A, it was confirmed that the evaluation results of the viewing angle were B or higher and excellent visibility with low viewing angle dependency was exhibited.

Further, it was confirmed that the transparent conductive films of Examples 1, 4, 7, and 9 did not satisfy the relationship of Expression (2), that is, 0≤W1A−W2A≤0.3×W1A, and the relationship of Expression (3), that is, W2A−W2B<W1A−W1B, and the evaluation results of the mesh visibility and the evaluation results of the viewing angle were B. However, the visibility and the metallic luster were at a level having no problem and practical transparent conductive films could be obtained.

Among Examples 1 to 12, the transparent conductive films of Examples 2, 3, 5, 6, and 8 were set to further satisfy the relationship of Expression (2), that is, 0≤W1A−W2A≤0.3×W1A, and the evaluation results of the mesh visibility were A.

Both the transparent conductive films of Examples 10 and 11 were set to satisfy the relationships of Expressions (1), (2), and (3), that is, W2A−W2B<W1A−W1B, and the evaluation results of the mesh visibility and the evaluation results of the viewing angle were A. It was confirmed that transparent conductive films having excellent visibility with low viewing angle dependency and not mesh visibility could be obtained.

In the transparent conductive film of Example 12 produced by using transfer, unlike other examples, although the thickness H2 of the second thin metal wire was set to be equal to the thickness H1 of the first thin metal wire, the relationships of Expressions (1), (2), and (3) were satisfied. The evaluation result of the viewing angle and the evaluation result of the mesh visibility were A. It was confirmed that a transparent conductive film having excellent visibility without viewing angle dependency and not mesh visibility could be obtained.

On the other hand, all of the transparent conductive film of Comparative Examples 1 to 3 did not satisfy the above relationship of Expression (1) and the evaluation results of the viewing angle were C. Thus, it was confirmed that there was a problem in viewing angle dependency.

EXPLANATION REFERENCES

1: transparent insulating substrate
1A: front surface
1B: rear surface
2, 3: copper wiring
4: blackened layer
11: touch panel
12: support
13: transparent conductive film
14: adhesive
31: transparent insulating substrate
31A: front surface
31B: rear surface
32: conductive member
33: protective layer
34: first electrode
35: first peripheral wiring
36: second electrode
37: second peripheral wiring
38, 58: first thin metal wire
38A: first front surface
38B: first back surface
38C, 39C: side surface
39, 59: second thin metal wire
39A: second front surface
39B: second back surface
40, 41, 44: blackened layer
42: first metal layer
43: second metal layer
45: first resist layer
46: second resist layer
47: first exposure mask
48: second exposure mask
49: transfer substrate
50: release layer
S1: transmissive region
S2: peripheral region
D1: first direction
D2: second direction
W1, W2, W1A, W1B, W2A, W2B: line width
H1, H2: thickness

What is claimed is:

1. A transparent conductive film having a transmissive region comprising:
    a transparent insulating substrate having a first surface that is directed to a viewing side and a second surface that is directed to a side opposite to the viewing side;
    a first electrode formed of first thin metal wires arranged on the first surface of the transparent insulating substrate in the transmissive region; and
    a second electrode insulated from the first electrode and formed of second thin metal wires arranged on the second surface of the transparent insulating substrate to intersect the first thin metal wire in the transmissive region,
    wherein the first thin metal wire has a first front surface being directed to the viewing side and having a line width W1A and a first back surface being directed to the side opposite to the viewing side and having a line width W1B,
    the second thin metal wire has a second front surface being directed to the viewing side and having a line width W2A and a second back surface being directed to the side opposite to the viewing side and having a line width W2B,
    the line widths W1A, W1B, W2A, and W2B are in a range of 0.5 to 10 μm, and
    the line width W1A is larger than the line width W1B and the line width W2A is larger than the line width W2B.

2. The transparent conductive film according to claim 1, wherein the line widths W1A and W2A satisfy a relationship of $$0 \leq W1A - W2A \leq 0.3 \times W1A.$$

3. The transparent conductive film according to claim 1, wherein the line widths W1A, W1B, W2A, and W2B satisfy a relationship of $$W2A - W2B < W1A - W1B.$$

4. The transparent conductive film according to claim 2, wherein the line widths W1A, W1B, W2A, and W2B satisfy a relationship of $$W2A - W2B < W1A - W1B.$$

5. The transparent conductive film according to claim 3, wherein a thickness H2 of the second thin metal wire is larger than a thickness H1 of the first thin metal wire.

6. The transparent conductive film according to claim 4, wherein a thickness H2 of the second thin metal wire is larger than a thickness H1 of the first thin metal wire.

7. The transparent conductive film according to claim 1, wherein the line width W1A is 1.5 μm or more and 5 μm or less, and the thickness H1 of the first thin metal wire and the thickness H2 of the second thin metal wire are 0.5 μm or more and 3 μm or less.

8. The transparent conductive film according to claim 3, wherein the line width W1A is 1.5 μm or more and 5 μm or less, and the thickness H1 of the first thin metal wire and the thickness H2 of the second thin metal wire are 0.5 μm or more and 3 μm or less.

9. The transparent conductive film according to claim 4, wherein the line width W1A is 1.5 μm or more and 5 μm or less, and the thickness H1 of the first thin metal wire and the thickness H2 of the second thin metal wire are 0.5 μm or more and 3 μm or less.

10. The transparent conductive film according to claim 1, wherein the first front surface of the first thin metal wire and the second front surface of the second thin metal wire are blackened layers.

11. The transparent conductive film according to claim 3, wherein the first front surface of the first thin metal wire and the second front surface of the second thin metal wire are blackened layers.

12. The transparent conductive film according to claim 4, wherein the first front surface of the first thin metal wire and the second front surface of the second thin metal wire are blackened layers.

13. The transparent conductive film according to claim 1, wherein the first thin metal wire and the second thin metal wire are formed of copper.

14. The transparent conductive film according to claim 3, wherein the first thin metal wire and the second thin metal wire are formed of copper.

15. The transparent conductive film according to claim 4, wherein the first thin metal wire and the second thin metal wire are formed of copper.

16. A method of producing the transparent conductive film according to claim 1 comprising:
- forming a first metal layer on the first surface of the transparent insulating substrate and a second metal layer on the second surface of the transparent insulating substrate;
- forming a patterned first resist layer on a surface of the first metal layer and a patterned second resist layer on a surface of the second metal layer;
- performing an adhesion reinforcing treatment for further enhancing adhesion between the first metal layer and the first resist layer than between the second metal layer and the second resist layer by reinforcing adhesion between the first metal layer and the first resist layer; and
- forming the first thin metal wire and the second thin metal wire by wet etching the first metal layer and the second metal layer respectively or simultaneously.

17. A method of producing the transparent conductive film according to claim 1 comprising:
- forming the first thin metal wire on the first surface of the transparent insulating substrate;
- forming the second thin metal wire on a surface of a transfer substrate; and
- transferring the second thin metal wire to the second surface of the transparent insulating substrate from the transfer substrate.

18. A touch panel using the transparent conductive film according to claim 1.

* * * * *